United States Patent
Chen et al.

(10) Patent No.: US 12,456,692 B2
(45) Date of Patent: Oct. 28, 2025

(54) MICROELECTRONIC PACKAGE RDL PATTERNS TO REDUCE STRESS IN RDLs ACROSS COMPONENTS

(71) Applicant: Apple Inc., Cupertino, CA (US)

(72) Inventors: Wei Chen, San Jose, CA (US); Yi Xu, Boise, ID (US); Jie-Hua Zhao, Cupertino, CA (US); Jun Zhai, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 368 days.

(21) Appl. No.: 18/058,991

(22) Filed: Nov. 28, 2022

(65) Prior Publication Data

US 2023/0317624 A1 Oct. 5, 2023

Related U.S. Application Data

(60) Provisional application No. 63/362,315, filed on Mar. 31, 2022.

(51) Int. Cl.
| | |
|---|---|
| *H01L 23/538* | (2006.01) |
| *H01L 23/00* | (2006.01) |
| *H01L 23/31* | (2006.01) |
| *H01L 25/065* | (2023.01) |
| *H01L 25/18* | (2023.01) |

(52) U.S. Cl.
CPC ...... *H01L 23/5386* (2013.01); *H01L 23/3128* (2013.01); *H01L 23/5383* (2013.01); *H01L 23/562* (2013.01); *H01L 25/0655* (2013.01); *H01L 25/18* (2013.01); *H01L 24/16* (2013.01); *H01L 24/48* (2013.01); *H01L 2224/16227* (2013.01); *H01L 2224/48225* (2013.01)

(58) Field of Classification Search
CPC ......................... H01L 23/5386; H01L 23/562
See application file for complete search history.

(56) References Cited

U.S. PATENT DOCUMENTS

| | | | | |
|---|---|---|---|---|
| 2020/0176432 | A1* | 6/2020 | Huang | ............ H01L 25/18 |
| 2021/0118844 | A1* | 4/2021 | Wu | ............ H01L 25/18 |
| 2021/0183773 | A1* | 6/2021 | Rubin | ............ H01L 24/17 |
| 2023/0017688 | A1* | 1/2023 | Lai | ............ H01L 21/6835 |
| 2024/0021540 | A1* | 1/2024 | Liu | ............ H01L 23/562 |

\* cited by examiner

*Primary Examiner* — Evan G Clinton
(74) *Attorney, Agent, or Firm* — Aikin & Gallant, LLP (57) ABSTRACT

Microelectronic packages and methods of fabrication are described. In an embodiment, a redistribution layer spans across multiple components, and includes a region of patterned wiring traces that may mitigate stress in the RDL between the multiple components.

18 Claims, 7 Drawing Sheets

MICROELECTRONIC PACKAGE RDL PATTERNS TO REDUCE STRESS IN RDLs ACROSS COMPONENTS

RELATED APPLICATIONS

This application claims the benefit of priority of U.S. Provisional Application No. 63/362,315 filed Mar. 31, 2022, which is incorporated herein by reference.

BACKGROUND

Field

Embodiments described herein relate to microelectronic packaging, and more particularly to mechanical integrity of redistribution layers.

BACKGROUND INFORMATION

The current market demand for portable and mobile electronic devices such as mobile phones, personal digital assistants (PDAs), digital cameras, portable players, gaming, and other mobile devices requires the integration of more performance and features into increasingly smaller spaces. As a result, various multiple-die packaging solutions such as system in package (SiP) and package on package (POP) have become more popular to meet the demand for higher die/component density devices. In one implementation, memory die or packages such as dynamic random-access memory (DRAM) which is generally considered a volatile memory, and/or non-volatile memory die or package, such as flash (e.g. NAND), are stacked on top of a logic die or package (e.g., application-specific integrated circuit (ASIC)) or system on chip (SoC). As the market for portable and mobile electronic devices advances larger logic and memory capability is required of the package. In one implementation, a plurality of logic dies are connected to one another in a first package level, and a plurality of memory dies or packages can be stacked on top of the first package level. The logic dies may be connected to one another using various packaging solutions such an interposer or redistribution layer (RDL).

SUMMARY

In accordance with embodiments, various layouts are described that may mitigate RDL stress across an RDL gap width between adjacent components. A microelectronic package may include an RDL, a first component on a first side of the RDL and a second component on the RDL. The first and second components are encapsulated in a molding compound layer on the first side of the RDL.

In an embodiment, the RDL may include a first group of wiring traces extending between the first and second components and a second group of wiring races extending substantially perpendicular to the first group of wiring traces, where the first wiring traces are wider than the second wiring traces. In this manner, the wider wiring traces can provide mechanical integrity to the RDL in a high stress region between the first and second component.

In an embodiment the RDL includes a first group of wiring traces extending at an oblique angle across an RDL gap width between the first component and the second component. In this manner, the angled wiring traces may be slightly lengthened, providing an increased metal density and mechanical integrity to the RDL in a high stress region between the first and second component.

DETAILED DESCRIPTION

Microelectronic packages and methods of fabrication are described. In particular, redistribution layers (RDLs) are described in which the RDLs span across multiple components, e.g. silicon-to-silicon, with metal traces such as copper. It has been observed that as the demand for thinner packages and consequently thinner RDLs continues that a high stress can be generated in the RDL across a gap separating adjacent components. For example, this may be due to local bending, as well as thermal expansion differences. RDL crack propagation within the RDL gap may thus lead to failure of the package. While increased metal (copper) density within the RDL may provide additional rigidity and strength to mitigate stress, there may be design rules limiting maximum metal density, such as requisite line spacing and count. In accordance with embodiments, various layouts are described that may mitigate RDL stress across the RDL gap between adjacent components.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "above", "over", "to", "between", "spanning" and "on" as used herein may refer to a relative position of one layer with respect to other layers. One layer "above", "over", "spanning" or "on" another layer or bonded "to" or in "contact" with another layer may be directly in contact with the other layer or may have one or more intervening layers. One layer "between" layers may be directly in contact with the layers or may have one or more intervening layers.

Figure 1A:
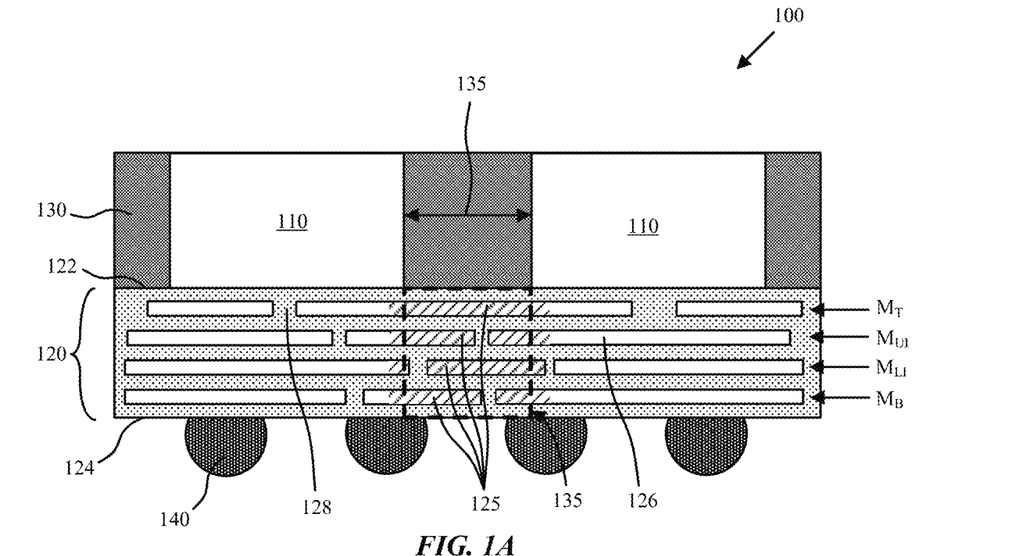
FIG. 1A is a schematic cross-sectional side view illustration of a microelectronic package including RDL wiring trace routing regions that are patterned to reduce stress in accordance with embodiments.

Referring now to FIG. 1A a schematic cross-sectional side view illustration is provided of a microelectronic package 100 including RDL wiring trace routing regions that are patterned to reduce stress in accordance with embodiments. As shown, the microelectronic package 100 can include a redistribution layer (RDL) 120, a first component 110 on a first side 122 of the RDL 120, and a second component 110 on the first side 122 of the RDL 120. The first component 110 and the second component 110 may be encapsulated in a molding compound layer 130 on the first side of the RDL 120. A plurality of solder bumps 140 may be provided on a second side 124 of the RDL 120, for example, for mounting onto a circuit board or other routing substrate. Thus, without an underlying stiffener structure the RDL 120 can be susceptible to stress induced defects by bending, thermal expansion, etc.

As shown in FIG. 1A the first component 110 and the second component 110 are separated by a gap 135, the dimensions of which (length, width) are translated to the underlying RDL 120 as RDL gap 135R. The RDL 120 in accordance with embodiments may include a single metal wiring layer (M) or multiple metal wiring layers. In the exemplary embodiment four metal wiring layers are illustrated including a top metal wiring layer (MT), an upper intermediate metal wiring layer (MuI), and lower intermediate metal wiring layer (MLI), and bottom metal wiring layer (MB). It is to be appreciated that this is an exemplary configuration, and embodiments may have more or less metal wiring layers. In some embodiments, the metal wiring layers (M) may include wiring traces 126 (also referred to as redistribution lines) and be separated by dielectric layers 128. The RDL 120 may be formed by a layer-by-layer process and may be formed at the wafer level using thin film technology. For example, the wiring traces 126 may be created by first forming a seed layer, followed by forming a metal (e.g. copper) pattern. Alternatively, redistribution lines may be formed by deposition (e.g. sputtering) and etching. The material of wiring traces 126 can include, but is not limit to, a metallic material such as copper, titanium, nickel, gold, and combinations or alloys thereof. The metal pattern of the wiring traces 126 is embedded in one or more dielectric layers 128, which is optionally patterned. The dielectric layer(s) 128 may be any suitable material such as an oxide, or polymer (e.g. polyimide). In an embodiment, the RDL 120 has a total thickness of less than 50 μm, or more specifically less than 30 μm. For example, each of the metal wiring layers, and dielectric layers may have a thickness of 5 μm or less.

In accordance with embodiments, a region of the RDL 120 spanning between the components 110 and underneath the gap 135 area between the components 110 may exhibit high stress due to bending or thermal expansion differences within the microelectronic package 100. In particular, the top metal wiring layer (MT) may be particularly susceptible to strain, though all layers within the RDL can bend together, and as such all metal wiring layers may be susceptible to strain. In accordance with embodiments, regions of the wiring traces 126 can be patterned to mitigate such strain. In accordance with embodiments, the patterned regions 125 can be provided in only the top available metal wiring layer, a subset of the metal wiring layers only, or all of the metal wiring layers. In the embodiment illustrated in FIG. 1A, the top available metal wiring layer may be the top metal wiring layer (MT). The patterned regions 125 may correspond to the RDL gap 135R area, though depending upon the particular package arrangement the patterned regions 125 may cover a larger or smaller area than the RDL gap 135R.

Figure 1B:
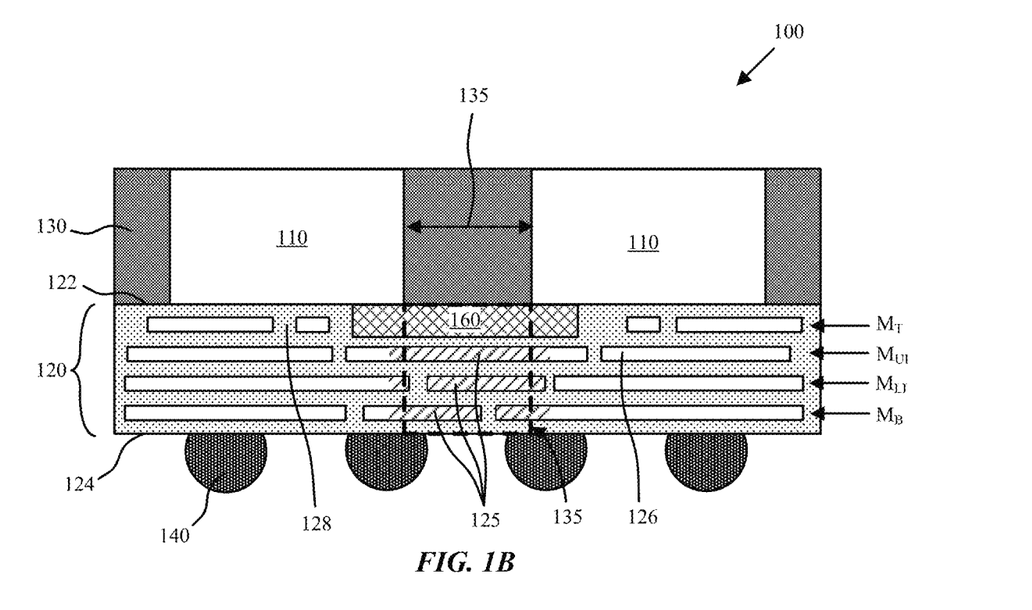
FIG. 1B is a schematic cross-sectional side view illustration of a microelectronic package including an RDL chiplet and RDL wiring trace routing regions that are patterned to reduce stress in accordance with embodiments.

In accordance with embodiments, the RDL 120 can include an additional structure such as an RDL chiplet 160, as shown in FIG. 1B, spanning between adjacent components 110 that may displace available wiring layers. The RDL chiplet 160 can be a silicon chiplet for example, with overlying fine wiring. The RDL chiplet 160 can include fine component-to-component wiring, and optionally any combination of active or passive devices. Where the RDL chiplet 160 is embedded in the RDL 120 the RDL chiplet 160 may displace one or more metal wiring layers between the components 110. As such, a metal wiring layer beneath the top metal wiring layer (MT) may be the top available metal wiring layer in accordance with embodiments that includes a patterned region 125 across the RDL gap 135R. Thus, the available metal wiring layers may correspond to those directly beneath the RDL chiplet 160. In both embodiments illustrated in FIGS. 1A-1B the top available metal wiring layer may be patterned to include patterned regions 125, only a subset of the available metal wiring layers may be patterned to include patterned regions 125, or all available metal wiring layers may be patterned to include patterned regions 125.

Figure 2A:
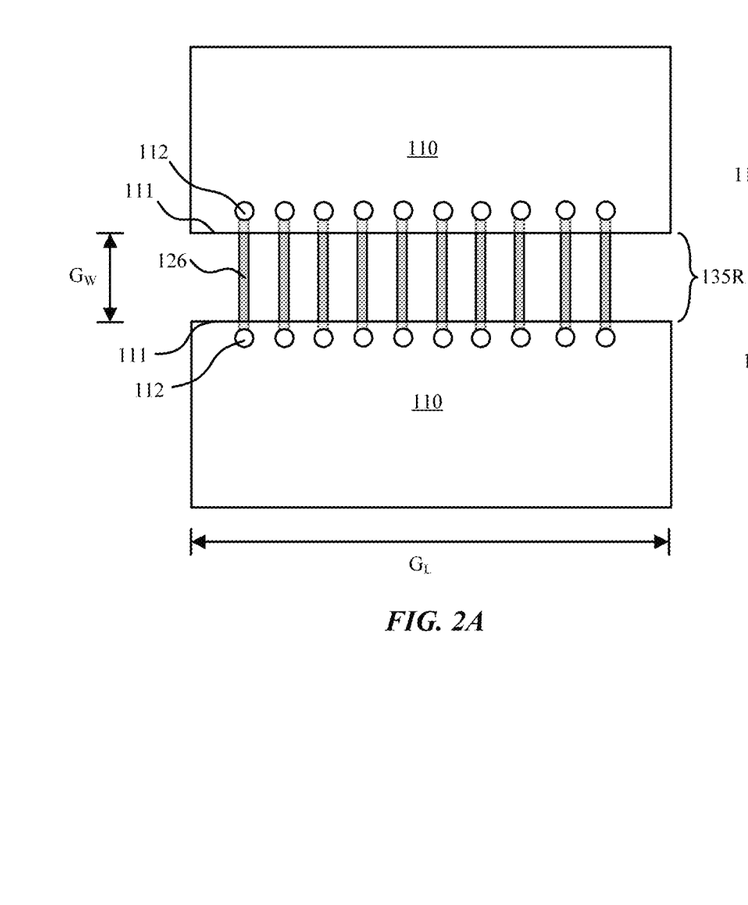
FIG. 2A is a schematic top-down illustration of perpendicular RDL wiring trace routing between components.
Figure 2B:
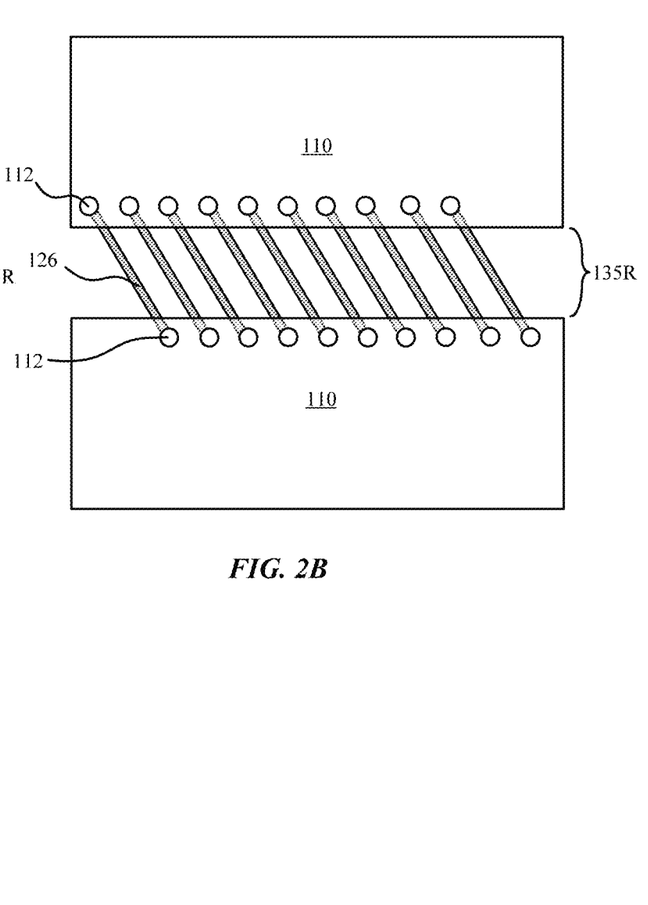
FIG. 2B is a schematic top-down illustration of angled RDL wiring trace routing between components in accordance with an embodiment.

Referring now to FIGS. 2A-2B, FIG. 2A is a schematic top-down illustration of perpendicular RDL wiring trace routing between components, and FIG. 2B is a schematic top-down illustration of angled RDL wiring trace routing between components in accordance with an embodiment. As shown in FIGS. 2A-2B the RDL gap 135R can be characterized by a gap width ($G_W$) extending between edges 111 of adjacent components 110, and a gap length ($G_L$) extending parallel to the edges 111 of the components 110. Wiring traces 126 can extend across the gap length ($G_L$) between opposing component 110 edges 111. In the exemplary illustration in FIG. 2A, wiring traces 126 extend substantially perpendicular to the gap length ($G_L$) between the components 110 and connect to terminals 112, which can be laterally opposite of one another. In the exemplary illustration in FIG. 2B, the wiring traces 126 (e.g. within the patterned regions 125) extend at an oblique angle across the gap width ($G_W$) between the components 110. In this manner, the angled wiring traces may be slightly lengthened, providing an increased metal density and mechanical integrity to the RDL in a high stress region between the first and second component.

Furthermore, the terminals 112 (e.g. landing pads, studs) of the components can be shifted to match the oblique angle. For example, the terminal 112 arrangement may be horizontally flipped, or rotated 180 degrees, such that a group of terminals for one component 110 is shifted laterally (e.g. closer to left edge, or right edge) relative to the other component. As shown, a first group of first terminals 112 of a first component 110 is laterally shifted relative to a second group of second terminals 112 of a second component 110 in a direction parallel to the gap length ($G_L$) between the first component and the second component. It is to be appreciated that while all traces are shown as connecting to terminals 112 for both components 110, this is for illustrative purposes and is not necessary for all embodiments, particularly with multiple metal wiring layers. Referring again to FIGS. 1A-1B in an embodiment the angled wiring traces 126 of FIG. 2B can be located in the top available metal wiring layer, a plurality of metal wiring layers, or all available metal wiring layers. The angled wiring traces 126 of FIG. 2B can be located in any combination of metal wiring layers. In an embodiment, the perpendicular wiring traces 126 of FIG. 2A can optionally be located underneath the angled wiring traces 126 of FIG. 2B.

Figure 3A:
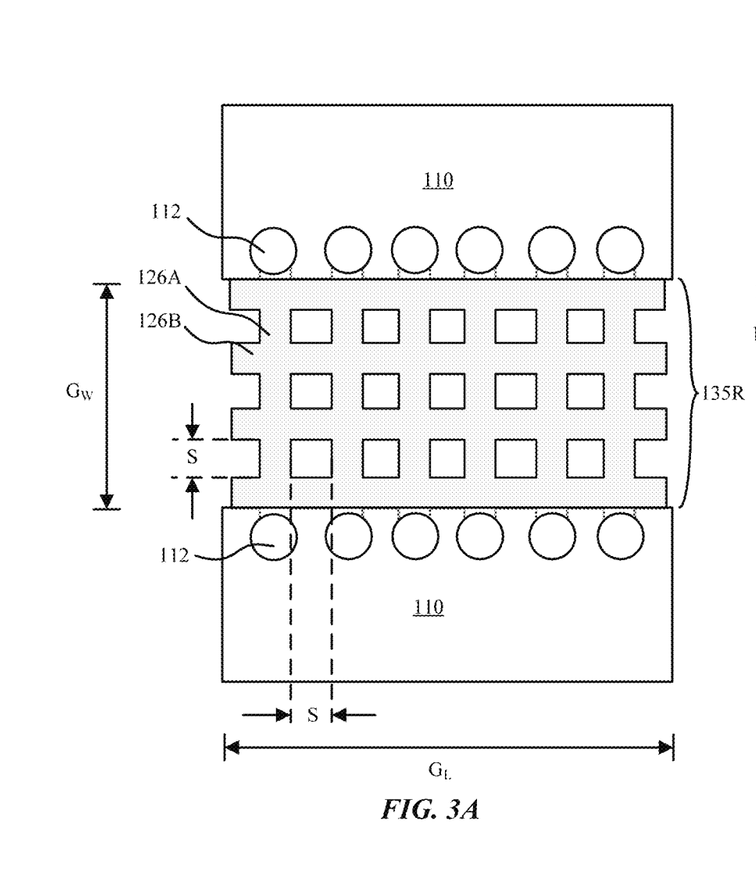
FIG. 3A is a schematic top-down illustration of RDL wiring trace routing with same metal density in an RDL gap.
Figure 3B:
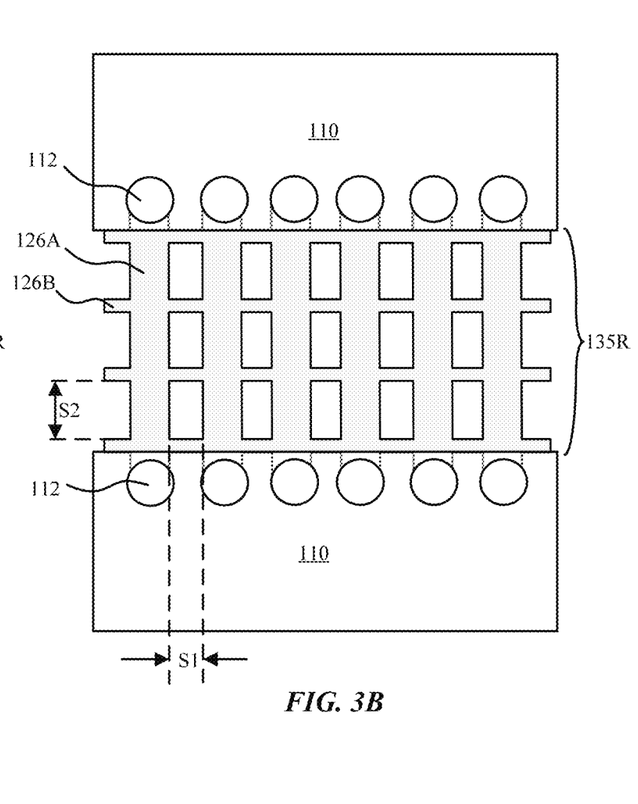
FIG. 3B is a schematic top-down illustration of RDL wiring trace routing with wider RDL wiring trace routing across an RDL gap width than parallel with the RDL gap length in accordance with an embodiment.

Referring now to FIGS. 3A-3B, FIG. 3A is a schematic top-down illustration of RDL wiring trace routing with same metal density in an RDL gap, and FIG. 3B is a schematic top-down illustration of RDL wiring trace routing with wider RDL wiring trace routing across an RDL gap width ($G_W$) than parallel with the RDL gap length ($G_L$) in accordance with an embodiment. As shown in FIGS. 3A-3B the RDL can include a first group of first wiring traces 126A across the gap width ($G_W$) between opposing component 110 edges, and a second group of second wiring traces 126B extending substantially perpendicular to the first group of first wiring traces 126A. The first group of first wiring traces 126A and the second group of second wiring traces 126B can be located in the same metal wiring layers. For example, the first and second wiring traces can form power planes or power meshes to transmit power (Vdd) or ground (Vss). In an embodiment, the first wiring traces 126A are connected to power terminals 112 in the first and second components 110.

In the embodiment illustrated in FIG. 3A the first wiring traces 126A and the second wiring traces 126B have a same width and are separated by a same line spacing(S). As a result, grid openings formed by overlapping first wiring traces and second wiring traces may be square. In the embodiment illustrated in FIG. 3B the first wiring traces 126A are wider than the second wiring traces 126. In an embodiment, the first wiring traces are less than 5 μm wide. Additionally, the first wiring traces 126A are separated by a first line spacing (S1) and the second wiring traces 126B are spaced apart by a second line spacing (S2) that is greater than the first line spacing. As a result, grid openings formed by overlapping first wiring traces and second wiring traces may be rectangular, with the longer sides formed by the first wiring traces 126A. In this manner, the wider wiring traces can provide mechanical integrity to the RDL in a high stress region between the first and second component without substantially changing the metal density. For example, the metal density of FIG. 3B may be the same as in FIG. 3A.

Referring again to FIGS. 1A-1B, the RDL may include multiple wiring layers, and the first group of first wiring traces 126A can be located in the top available metal wiring layer, a plurality of metal wiring layers, or all available metal wiring layers. The angled wiring traces 126 of FIG. 3B can be located in any combination of metal wiring layers. The second group of second wiring traces 126B can be located in the same metal wiring layers as the first group of first wiring traces 126, or optionally in separate metal wiring layer(s). In an embodiment, both the first group of first wiring traces 126A and the second group of second wiring traces 126B of FIG. 3B form a mesh located in the top available metal wiring layer. Such a mesh structure can be located in a single metal wiring layer, a plurality of metal wiring layers, or all available metal wiring layers.

In an embodiment, the second group of second wiring traces 126B is located in a metal wiring layer beneath the top available metal wiring layer. In an embodiment, the wiring trace configuration of FIG. 3B is located in a metal wiring layer above a wiring trace configuration of FIG. 3A. For example, the RDL 120 can include a metal wiring layer beneath the top metal wiring layer with a third group of wiring traces extending between the first component and the second component, where the first wiring traces 126A (FIG. 3B) are wider than the third wiring traces (126A of FIG. 3A)

Figure 4:
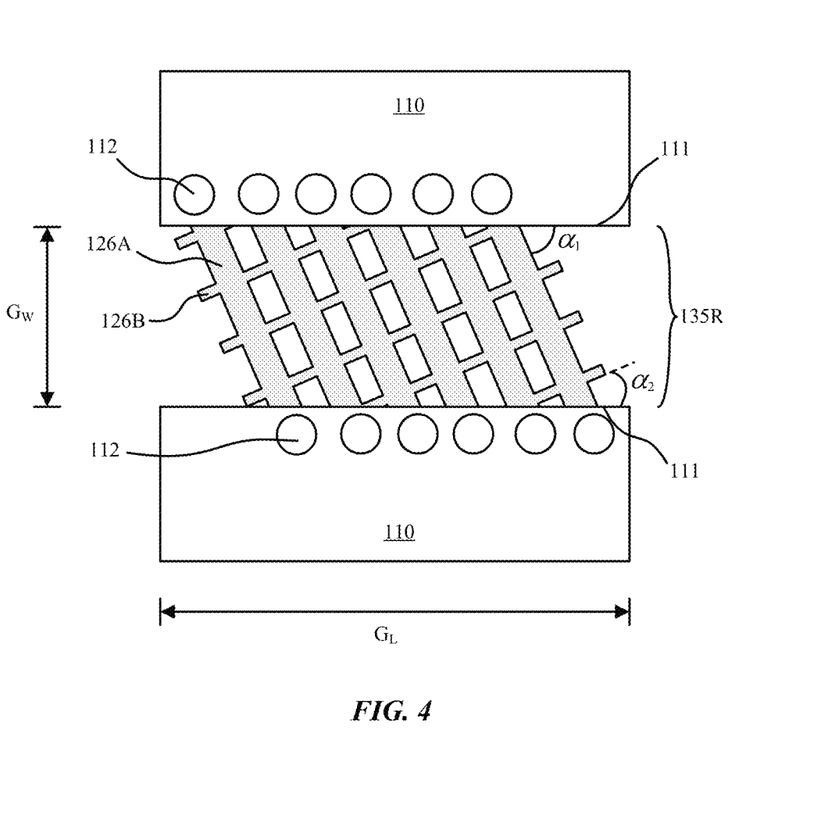
FIG. 4 is a schematic top-down illustration of angled RDL wiring trace routing with wider and narrower RDL wiring trace routing in accordance with an embodiment.

FIG. 4 is a schematic top-down illustration of angled RDL wiring trace routing with wider and narrower wiring trace routing in accordance with an embodiment. In particular, FIG. 4 combines features of FIGS. 2B and 3B. In interest of clarity and conciseness a description of the similar features is not repeated. In the illustrated embodiment the first wiring traces 126A are parallel to one another and extend at a first oblique angle across the gap width ($G_W$) between the components 110. As shown, the first oblique angle ($\alpha_1$) is made with regard to the component 110 edges 111 forming the gap 135 and RDL gap 135R. Similarly, the second wiring traces 126B can extend substantially perpendicular to the first wiring traces 126B and form a second oblique angle ($\alpha_2$) with the component 110 edges 111. The second oblique angle ($\alpha_2$) may be smaller than the first oblique angle ($\alpha_1$). The first and second oblique angles may be acute angles.

Figure 5A:
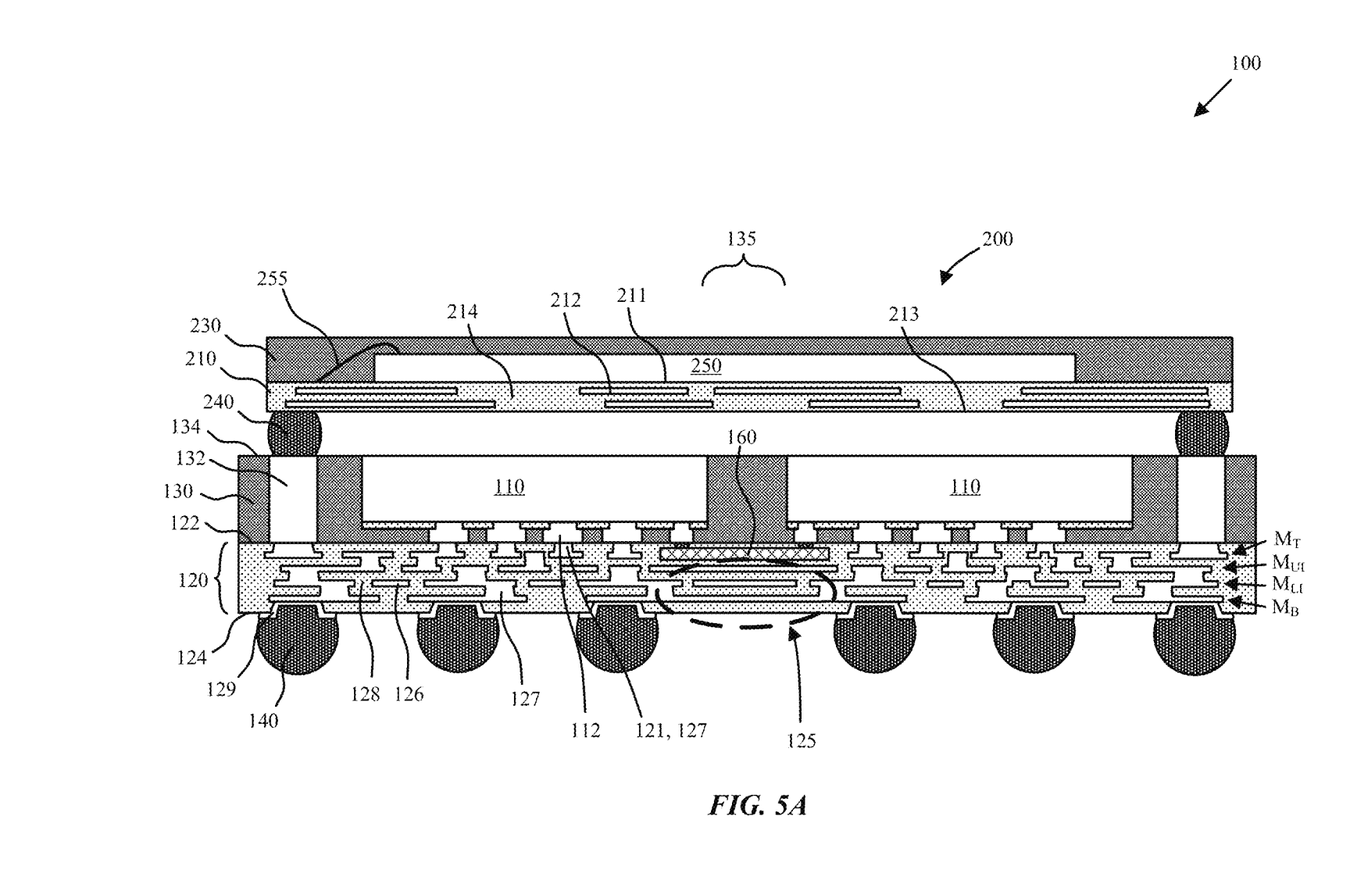
FIGS. 5A-5B are schematic cross-sectional side view illustrations of microelectronic packages including RDL wiring trace routing in accordance with embodiments.
Figure 5B:
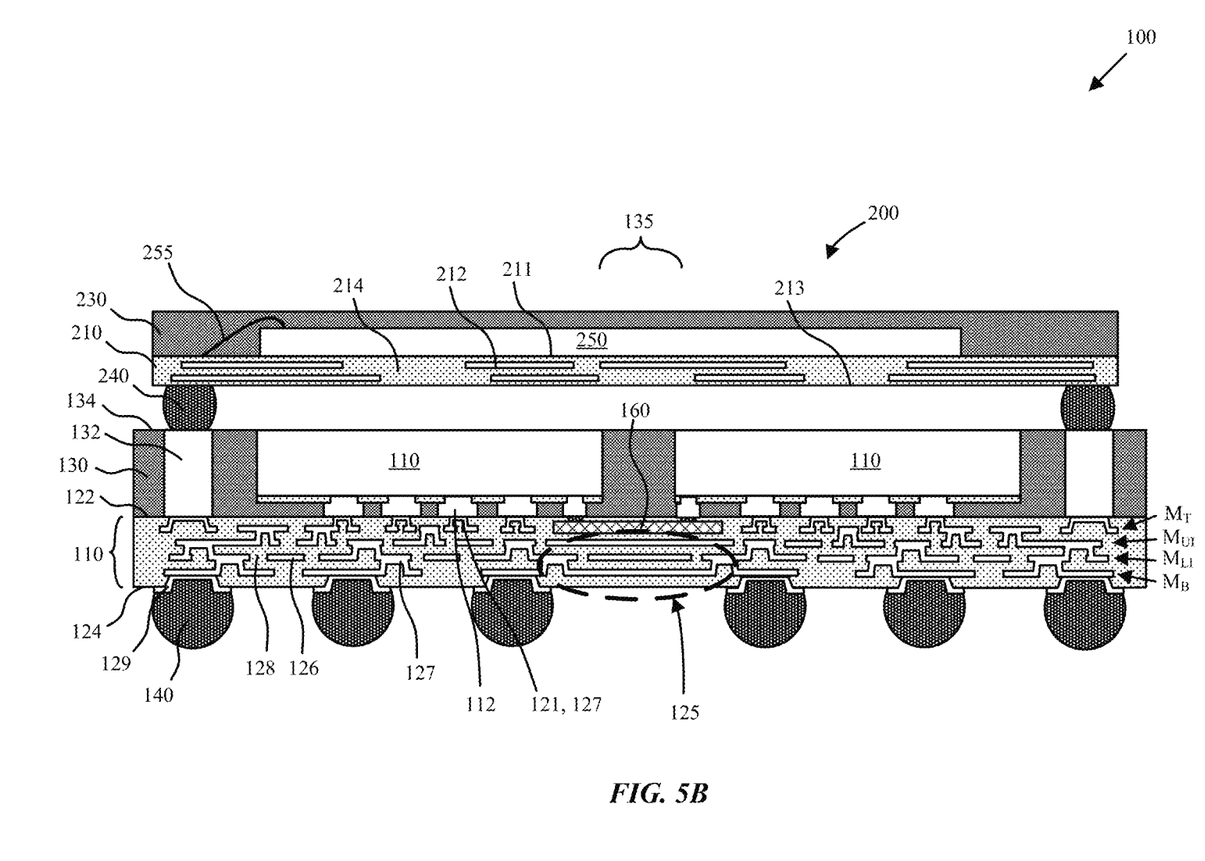

FIGS. 5A-5B are schematic cross-sectional side view illustrations of microelectronic packages including RDL wiring trace routing in accordance with embodiments. Similar to FIGS. 1A-1B, the microelectronic packages 100 of FIGS. 5A-5B can include a redistribution layer (RDL) 120, a first component 110 on a first side 122 of the RDL 120, and a second component 110 on the first side 122 of the RDL 120. The RDL 120 may optionally include an embedded RDL chiplet 160. The first component 110 and the second component 110 may be encapsulated in a molding compound layer 130 on the first side of the RDL 120. A plurality of solder bumps 140 may be provided on underbump metallurgy (UBM) pads 129 on a second side 124 of the RDL 120, for example, for mounting onto a circuit board or other routing substrate. The RDL 120 in accordance with embodiments may include a single metal wiring layer (M) or multiple metal wiring layers. The metal wiring layers (M) may include wiring traces 126 (also referred to as redistribution lines) and be separated by dielectric layers 128.

The RDL 120 may be formed by a layer-by-layer process and may be formed at the wafer level using thin film technology. For example, the wiring traces 126 may be created by first forming a seed layer, followed by forming a metal (e.g. copper) pattern. In the embodiment illustrated in FIG. 5A vias 127 may completely fill via openings formed in the dielectric layers 128. The redistribution lines and vias may alternatively be formed by deposition (e.g. sputtering) and etching. In the embodiment illustrated in FIG. 5B, vias 127 are formed with thin film deposition techniques and a thickness of the wiring traces 126 can conformally line the via openings patterned in the dielectric layers 128 to form lined vias.

The material of wiring traces 126 can include, but is not limited to, a metallic material such as copper, titanium, nickel, gold, and combinations or alloys thereof. The metal pattern of the wiring traces 126 and vias 127 is embedded in one or more dielectric layers 128, which is optionally patterned. The dielectric layer(s) 128 may be any suitable material such as an oxide, or more particularly an inorganic material such as polymer (e.g. polyimide). In an embodiment, the RDL 120 has a total thickness of less than 50 μm, or more specifically less than 30 μm. For example, each of the metal wiring layers, and dielectric layers may have a thickness of 5 μm or less.

In accordance with embodiments, a region of the RDL 120 spanning between the components 110 and underneath the gap 135 area between the components 110 may exhibit high stress due to bending or thermal expansion differences within the microelectronic package 100. In particular, the top available metal wiring layer, a plurality of metal wiring layers, or all metal wiring layers may be particularly susceptible to strain. In accordance with embodiments, regions 125 of the wiring traces 126 can be patterned to mitigate such strain. In accordance with embodiments, the patterned regions 125 can be provided in only the top available metal wiring layer, a subset of the metal wiring layers only, or all of the available metal wiring layers.

In accordance with embodiments, contact pads 121 or vias 127 of the RDL 120 can be formed directly on terminals 112 of the components 110. For example, terminals can be metal studs or contact pads. The contact pads 121 or vias 127 may also be formed directly on vertical interconnects 132 extending through the molding compound layer 130 or other suitable fill material such as an oxide. The vertical interconnects can be through dielectric vias, such as through oxide vias (TOVs) or through mold vias (TMVs) formed after the molding compound layer 130. The vertical interconnects 132 can also be pre-formed prior to molding, such as metal pillars or printed circuit board (PCB) bars, etc.

In the particular embodiments illustrated in FIGS. 5A-5B one or more additional components 250 or packages 200 can be mounted over the first package level. For example, the additional components 250 or packages 200 can be bonded to the vertical interconnects 132 with solder bumps 240. Alternatively, a second level RDL can be formed over a top side 134 of the molding compound layer 130 to provide additional routing, and one or more components 250 or packages 200 can be bonded to the second level RDL, which is in electrical contact with the RDL 120 with the vertical interconnects 132.

In some embodiments, the top components 250 are non-volatile memory dies (e.g. NAND) or volatile-memory dies such as dynamic random-access memory (DRAM) dies, and the first components 110 are a logic dies, such as application-specific integrated circuit (ASIC) or system on chip (SoC) dies. The top package 200 may have a variety of configurations in accordance with embodiments. For example, the top package 200 may include a top package RDL 210, that may include one or more redistribution lines 212 and dielectric layers 214. In an embodiment, the component 250 is attached to a top side 211 the top package RDL 210 with a die attach film, and electrically connected to the top package RDL 210 with a wire bond 255. An underfill material may be applied in the space below the bottom side 213. The component 250, and optional wire bond 255, may be encapsulated in a top package molding compound 230 on the top side 211 of the top package RDL 210.

Figure 6A:
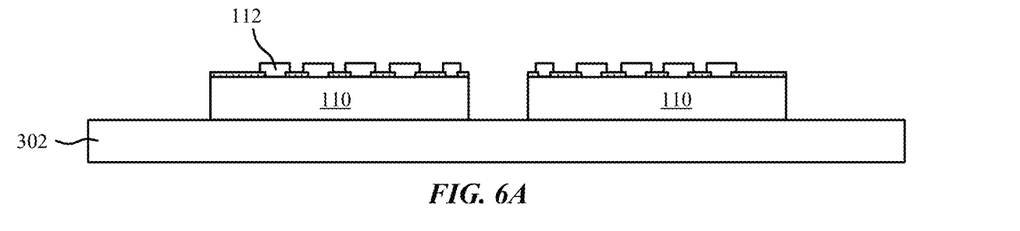
FIGS. 6A-6D are schematic cross-sectional side view illustrations of a die-first sequence of forming a microelectronic package in accordance with an embodiment.
Figure 6B:
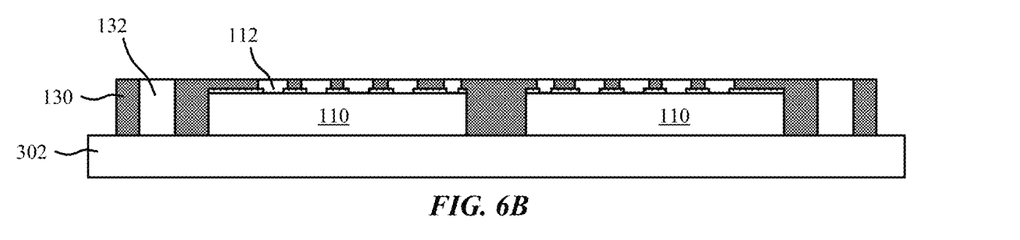

FIGS. 6A-6D are schematic cross-sectional side view illustrations of a die-first sequence of forming a microelectronic package in accordance with an embodiment. As shown in FIG. 6A, a plurality of components 110 can be mounted face-up onto a rigid carrier substrate 302 such as a glass panel, etc. For example, the back sides of the components can be placed onto the carrier substrate with an adhesive tape. The components 110 can then be encapsulated in a molding compound layer 130 or other suitable fill material, followed by formation of the vertical interconnects 132 as TMVs as shown in FIG. 6B. The structure may then optionally be planarized. Alternatively, the vertical interconnects 132 can be pre-formed prior to molding, such as copper pillars or PCB bars, etc. Embodiments are not limited to the processing sequence of FIGS. 6A-6B however. In an alternative processing sequence the components 110 can be placed face down onto a carrier substrate, followed by molding, attachment of a second carrier substrate and removal of the first carrier substrate, resulting in a structure substantially similar to FIG. 6B.

Figure 6C:
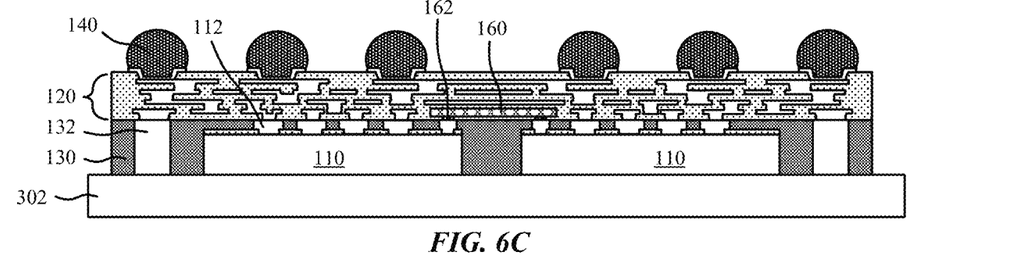
Figure 6D:
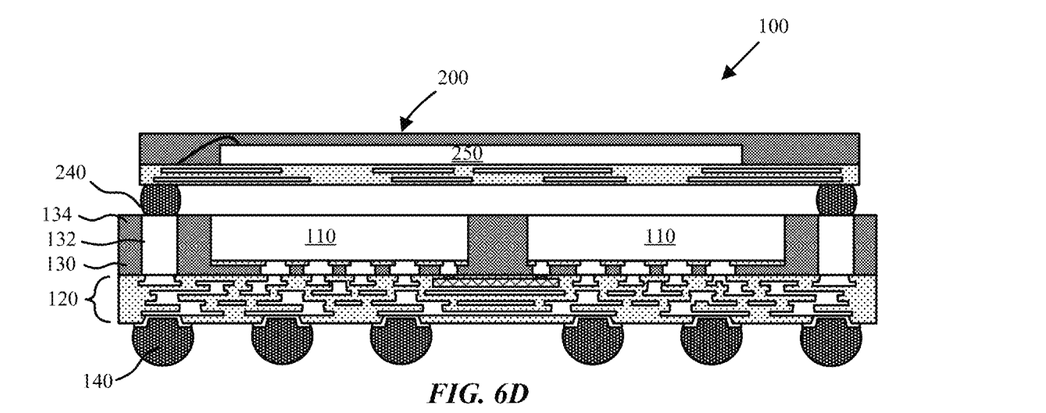

Referring now to FIG. 6C the RDL 120 can be formed directly on the molding compound layer 130, vertical interconnects 132 and terminals 112 of the components. For example, vias 127 or contact pads 121 can be formed directly on the terminals 112 and vertical interconnects 132 further leading to overall thickness reduction. In accordance with embodiments, an RDL chiplet 160 can also be bonded to the terminals 112 of the components, for example with microbumps 162, followed by formation of the remainder of the RDL 120. Solder bumps 140 may then be applied to the UBM pads, followed by removal of the carrier substrate 302. As shown in FIG. 6D, the top components 250 or packages 200 can then be mounted over the components 110 and the top side 134 of the molding compound layer 130, and optionally underfilled. Multiple packages can then be singulated.

In utilizing the various aspects of the embodiments, it would become apparent to one skilled in the art that combinations or variations of the above embodiments are possible for forming RDL patterns across components. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A microelectronic package structure comprising:
   a redistribution layer (RDL);
   a first component on a first side of the RDL, and a second component on the first side of the RDL;
   wherein the first component and the second component are encapsulated in a molding compound layer on the first side of the RDL; and
   wherein the RDL includes a first group of first wiring traces extending between the first component and the second component, and a second group of second wiring traces extending substantially perpendicular to the first group of wiring traces, wherein the first wiring traces are wider than the second wiring traces.

2. The microelectronic package structure of claim 1, wherein the first wiring traces are spaced apart by a first line spacing, and the second wiring traces are spaced apart by a second line spacing that is greater than the first line spacing.

3. The microelectronic package structure of claim 1, wherein the first wiring traces extend substantially perpendicular to a gap length between the first component and the second component.

4. The microelectronic package structure of claim 1, wherein the first wiring traces are parallel to one another and extend at an oblique angle across a gap width between the first component and the second component.

5. The microelectronic package structure of claim 4, wherein the first component includes a first group of first terminals connected to the first wiring traces and the second component includes a second group of second terminals connected to the first wiring traces, wherein the first group of first terminals is laterally shifted relative to the second group of second terminals in a direction parallel to a gap length between the first component and the second component.

6. The microelectronic package structure of claim 1, wherein the first wiring traces are connected to power terminals in the first component and the second component.

7. The microelectronic package structure of claim 1, wherein:
the RDL includes multiple metal wiring layers; and
the first group of first wiring traces is located in a top metal wiring layer of the RDL.

8. The microelectronic package structure of claim 1, wherein:
the RDL includes an RDL chiplet; and
the first group of first wiring traces is located beneath the RDL chiplet.

9. The microelectronic package structure of claim 8, wherein the first wiring traces are less than 5 microns wide and less than 5 microns thick.

10. The microelectronic package structure of claim 8:
wherein the RDL includes multiple metal wiring layers;
wherein the first group of wiring traces and the second group of wiring traces is located in a first metal wiring layer beneath the RDL chiplet; and
wherein the multiple metal wiring layers includes a second metal wiring layer including a third group of third wiring traces extending between the first component and the second component, wherein the first wiring traces are wider than the third wiring traces.

11. The microelectronic package structure of claim 8:
wherein the RDL includes multiple metal wiring layers;
wherein the first group of wiring traces and the second group of wiring traces is located in a first metal wiring layer; and
wherein the multiple metal wiring layers includes a second metal wiring layer including a third group of third wiring traces extending between the first component and the second component, and a fourth group of fourth wiring traces extending substantially perpendicular to the third group of wiring traces, wherein the third wiring traces are wider than the fourth wiring traces.

12. The microelectronic package structure of claim 1, the RDL include multiple metal wiring layers separated by multiple organic dielectric layers.

13. A microelectronic package structure comprising:
a redistribution layer (RDL);
a first component on a first side of the RDL, and a second component on the first side of the RDL;
wherein the first component and the second component are encapsulated in a molding compound layer on the first side of the RDL; and
wherein the RDL includes a first group of first wiring traces extending at an oblique angle across a gap width between the first component and the second component, and a second group of second wiring traces extending substantially perpendicular to the first group of wiring traces, wherein the first wiring traces are wider than the second wiring traces.

14. The microelectronic package structure of claim 13, wherein:
the RDL includes multiple metal wiring layers; and
the first group of first wiring traces is located in a top metal wiring layer of the RDL.

15. The microelectronic package structure of claim 13, wherein:
the RDL includes multiple metal wiring layers; and
the multiple metal wiring layers includes a second metal wiring layer beneath a first metal wiring layer, and the first group of first wiring traces is located in the first wiring layer and the second group of wiring traces is located in the second wiring layer.

16. The microelectronic package structure of claim 13, wherein:
the RDL includes multiple metal wiring layers and an RDL chiplet; and
the first group of wiring traces is located in a first metal wiring layer beneath the RDL chiplet.

17. The microelectronic package structure of claim 16, wherein the first metal wiring layer is less than 5 microns thick, and the first wiring traces are less than 5 microns wide.

18. The microelectronic package structure of claim 13, the RDL includes multiple metal wiring layers separated by multiple organic dielectric layers.

* * * * *